United States Patent [19]

Takehashi et al.

[11] Patent Number: 5,316,204
[45] Date of Patent: May 31, 1994

[54] METHOD FOR BONDING LEAD WITH ELECTRODE OF ELECTRONIC DEVICE

[75] Inventors: Shinitsu Takehashi, Shijonawate; Kenzo Hatada, Katano; Hiroaki Fujimoto, Hirakata, all of Japan

[73] Assignee: Matsushita Electric Industrial Co., Ltd., Osaka, Japan

[21] Appl. No.: 973,636

[22] Filed: Nov. 9, 1992

[30] Foreign Application Priority Data

Nov. 8, 1991 [JP] Japan .................. 3-292765

[51] Int. Cl.⁵ .............................. B23K 31/02
[52] U.S. Cl. ..................... 228/179.1; 228/160; 228/6.2
[58] Field of Search ............ 228/179, 160, 6.2, 13, 228/110, 247

[56] References Cited

U.S. PATENT DOCUMENTS

| | | | |
|---|---|---|---|
| 3,995,845 | 12/1976 | Scheffer | 228/179 |
| 4,019,876 | 4/1977 | Stöckel et al. | 228/110 |
| 4,422,568 | 12/1983 | Elles et al. | 228/179 |
| 4,589,584 | 5/1986 | Christiansen et al. | 228/110 |
| 4,875,618 | 10/1989 | Hasegawa et al. | 228/179 |

FOREIGN PATENT DOCUMENTS 2-62055 3/1990 Japan .
3-32040 2/1991 Japan .

Primary Examiner—Paula A. Bradley
Assistant Examiner—Jeffrey T. Knapp
Attorney, Agent, or Firm—Ratner & Prestia

[57] ABSTRACT

A method for bonding leads of a film carrier to electrodes of electronic devices includes a step for positioning the leads and the electrodes with a predetermined clearance aligned to define corresponding pairs of the leads and electrodes, and a step for placing a bonding tool having a conductive bonding material served such that the conductive bonding material is located between the lead and electrode of one of the corresponding pairs. The method further includes a step for pressing the lead of one corresponding pair such that the conductive bonding material is pressed between the lead and the electrode, thereby bonding the lead and electrode. After bonding, the conductive bonding material is pulled to cut and leave the bonded conductive bonding material. Then, while the bonding tool is released from the bonded pair, the conductive bonding material is served to the bonding tool for the next bonding operation.

8 Claims, 15 Drawing Sheets x 200

METHOD FOR BONDING LEAD WITH ELECTRODE OF ELECTRONIC DEVICE

BACKGROUND OF THE INVENTION

1. Field of the Invention

The present invention relates to a method for bonding a lead to an electronic device, more particularly, to a method for bonding a terminal lead provided on a film carrier with electrodes of a large scale integrated circuit (LSI) chip for packing in a tape automated bonding (TAB) package.

2. Description of the Prior Art

With recent advances in the high integration methods to mount a plurality of electric/electronic components on a single semiconductor chip such as a LSI and a very large scale integrated circuit (VLSI), the cost reduction of, the high performance of, and downsizing of the electronic devices are achieved. Among such high integration methods, a bump bonding method in which an electrode of a semiconductor chip is bonded with a lead of the film carrier via a bump formed on the electrode is widely used. The film carrier is made of an elastic material such as a polyamide and is provided with a wiring pattern formed thereon. From the wiring pattern, the leads are extended for bonding with the electrodes formed on the surface of semiconductor chip. In this method, the bumps made of conductive materials such as gold and solders should be formed on electrodes before and independently from the bonding operation.

In FIGS. 11A to 11E, the steps for forming the bumps on the semiconductor wafer according to a bump-on-wafer technology, for an example of such bump bonding methods, are shown.

As shown in FIG. 11A, at the first step, a plurality of electrode elements 60 are formed on a surface of a semiconductor wafer 30 by using an electroplating technology. A conductive layer 31, so called "a barrier metal", is vapor deposited on the surface of semiconductor wafer 30 over the electrode elements 60 to cover it entirely. The conductive layer 31 is made of conductive metals such as titanium and palladium.

As shown in FIG. 11B, at the second step, an insulation layer 33 is further formed over the conductive layer 31. The insulation layer 33 is made of a photo sensitive insulation material such as a photo resist.

As shown in FIG. 11C, at the third step, a number of openings 34 are formed in the insulation layer 33 to expose the conductive layer 31 covering the electrode elements 60 by using a photo mask (not shown) having a pattern corresponding to those of the electrode elements 60.

As shown in FIG. 11D, at the fourth step, the semiconductor wafer 30, thus prepared to have openings 34, is immersed in an electrolytic solution and then the conductive layer 31 is connected to an electric source. The conductive layer 31 in the openings 34, exposed to the electrolytic solution, serves as an electrode. Thus, gold included in the electrolytic solution is deposited on the conductive layer 31 in the openings 34. Then, this deposition grows up to form a bump 54 in each opening 34.

As shown in FIG. 11E, at the fifth step, the semiconductor wafer 30 is etched to remove insulation layer 33 and the conductive layer 31 on the portions excluding the bumps 54 from the semiconductor wafer 30. Thus, the bumps 54 are completely formed on each electrode element 60, independent of each other.

In FIGS. 12A to 12C, the steps for bonding bumps 54 of a semiconductor chip 59 with leads 55 of a film carrier 56 are shown.

As shown in FIG. 12A, at the first step, the semiconductor chip 59, cut from the semiconductor wafer 30 with bumps 54, is placed on a heating stage 67. The film carrier 56 is located above the semiconductor chip 59 and is positioned such that leads 55 are located over corresponding bumps 54 (electrode elements 60).

As shown in FIG. 12B, at the second step, the leads 55 are pressed against the bumps 54 by a hot pressure tool 61 so that the leads 55 are bonded to the bumps 54, resulting in an electrical connection between leads 55 and electrode element 60 via bumps 54.

As shown in FIG. 12C, at the third step, the hot pressure tool 60 is removed from the leads 55 bonded to the bumps 54. Thus, a number pair of leads 55 and bumps 54 are bonded at one time in a manner of so called "gang bonding".

In FIGS. 13A and 13B, another method for forming bumps, according to the conventional ball-bonding technology, is shown. First, a golden ball 71 is formed by applying an electric spark to the end of golden wire 70 fed by a capillary tool 72. Second, the thus formed golden ball 71 is pressure bonded to he electrode element 60. Then, the golden wire 70 is cut to leave the golden ball 71 as bump 73 bonded to the electrode element 60, as shown in FIG. 13A. By repeating the above described operations, bumps 60 made by golden ball 73 are formed on every electrode element 73, as shown in FIG. 13B.

In FIGS. 14A and 14B, still another method for forming bumps is shown. In this method, the end portion of a lead 55 is etched to have an end projection 75 formed in a mesa-like shape. This end projection 75 serves as a bump for connection between the lead 55 and the electrode element 60 (not shown) of the semiconductor chip 59 (not shown). However, the end projection 75 made of copper has a hardness greater than the usual bumps made of gold. Therefore, the end projection 75 could damage the oxide layer, under the electrode element 60, of the semiconductor chip 59 when the end projection 75 (leads 55) is pressed against the electrode element 30, resulting in so much degradation and less reliable quality of the semiconductor chip.

With demands for high performance and multi functions of semiconductor chips, the high integration of a plurality of components mounted on a single chip is promoted, causing the semiconductor chip to have multi-leads. Especially such semiconductor chips as micro processors and gate arrays are usually designed according to special specification to satisfy the user's own requirements and are developed in a short lead time. In FIG. 15, a single-point bonding method is shown, which is employed for TAB packaging of such semiconductor chips. In this single bonding method, a bonding tool 61 having a contacting end whose area is almost the same as the electrode is used to press leads 55 of the film carrier 56 against corresponding bumps 54 for the pressure bonding therebetween.

In FIGS. 16A to 16C, the steps for bonding a lead with an electrode of a semiconductor chip, according to the single point bonding method, are shown.

As shown in FIG. 16A, at the first step, the semiconductor chip 59 and film carrier 56 are placed on the heating stage 67 in a manner similar to those described with reference to FIG. 12A.

As shown in FIG. 16B, at the second step, each of the leads 55 is pressed against the bump 54 by a bonding tool 61. At the same time an ultra sonic is applied to the bump 54 so that the bump 54 deforms and bonds with the lead 55, causing the bump to electrically connect with the lead 55. As shown in FIG. 16C, at the third step, the second step is repeated to each corresponding pair of leads 55 and bumps 54 until all pairs are bonded. The single point bonding method can be used regardless of the type of bumps formed on the semiconductor chip. Thus, the single point bonding method can be applied for both technologies of the bump-on-wafer and ball-bonding.

Other than the bonding methods described above, a wire bonding technology is usually used for packaging the semiconductor chip. In the wire bonding technology, however, the electrode element of semiconductor chip and electrode of the package are bonded by a fine metallic wire extending therebetween. The fine metallic wire is made of conductive metals such as gold, aluminum, and copper and has a diameter on the order of several tens of micrometer. Therefore, the process, material, and facilities used by the wire bonding technology are different form those of the above described methods for bonding a semiconductor chip with the film carrier.

However, the bonding technologies described above have the following problems with respect to the TAB packaging of the semiconductor chip. Both in the bump-on-wafer technology and the transferred bump technology (shown in FIGS. 14A and 14B), bumps should be formed on the electrode elements of the semiconductor chip and on leads of the film carrier, respectively, before bonding, further causing the following difficulties.

In the bump-on-wafer technology, the semiconductor chip should be formed with bumps on the electrode elements thereof by vapor depositing and photolithographing methods before the semiconductor chips are cut from the wafer. To achieve this, a photo mask is used for electroplating process of the bump forming. The photo mask has a mask pattern corresponding to the positions of leads and electrode elements. Therefore, it is necessary to prepare photo masks having different mask patterns according to those of semiconductors, resulting in the increase of bump manufacturing cost and the reduction of manufacturability. Thus, it is very difficult to apply TAB packaging to semiconductor chips which with various kind but in a small production lot. Furthermore, since the bump forming process has too much manufacturing steps and complicated manufacturing steps, expensive facilities are required for performing such steps, causing the bump forming cost to be increased. Additionally, the processes of vapor deposition, photolithograph, and etching used for forming bumps causes the semiconductor chip to degrade, resulting in the reduction of yield.

In the transferred bump transfer technology, bumps on the leads are formed by transferring the bumps from the bump forming matrix, requiring the transferring process and facilities. Since the bump forming matrix has bumps formed therein at positions corresponding to the electrodes of the semiconductor chip, it is necessary to prepare the bump forming matrix according to kinds of semiconductor chips, resulting in the increase of bump forming matrix manufacturing cost and the reduction of manufacturability. Thus, it is very difficult to apply TAB packaging to semiconductor chips which with various kind but in a small production lot.

In the ball bump technology, the electrode elements of the semiconductor chip suffer from such stresses as an impact load and two thermal stresses, when the bump is formed thereon and when the lead is bonded with the bump. Such stresses cause the oxide layer under the electrode element to crack, resulting in the reduction of yield.

In case that the end portion of a lead is etched to have an end projection having a mesa-like shape, it is necessary to prepare the special tool and facilities for etching the lead end, resulting in the increase of cost of the film carrier. Additionally, since the lead is made of such a metal approximately three times as hard as gold, the oxide layer under the electrodes are broken and cracked when the end projection is pressed against the electrode for bonding therewith. The lead is plastically deformed and bonded with the electrode. However, the lead is too hard to deform to bond with the electrode with sufficient bonding force, resulting in the reduction of yield.

SUMMARY OF THE INVENTION

An object of the present invention is therefore to provide an imaging device which solves these problems.

The present invention has been developed with a view to substantially solving the above described disadvantages and has for its essential object to provide an improved method for bonding a lead with an electrode of an electronic device.

In order to achieve the aforementioned objective, a method for bonding leads of a film carrier to electrodes of electronic devices comprises the steps of positioning said leads and said electrodes with a predetermined clearance therebetween such that said leads and said electrodes are aligned to define corresponding pairs of said leads and said electrodes; placing a pressure means having a contact area and a conductive bonding material served under said contact area such that said conductive bonding material is located between one of said lead and said electrode of one of said corresponding pairs pressing said lead of said one of corresponding pair by said contact area of said pressure means such that said conductive bonding material is pressed between said lead and said electrode with a predetermined pressure for bonding said one corresponding pair of lead and electrode; pulling said conductive bonding material for cutting said conductive bonding material at a position near said bonded corresponding pair; releasing said pressure means from said bonded lead and electrode; and serving said conductive bonding material under said contact area of said pressure means.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
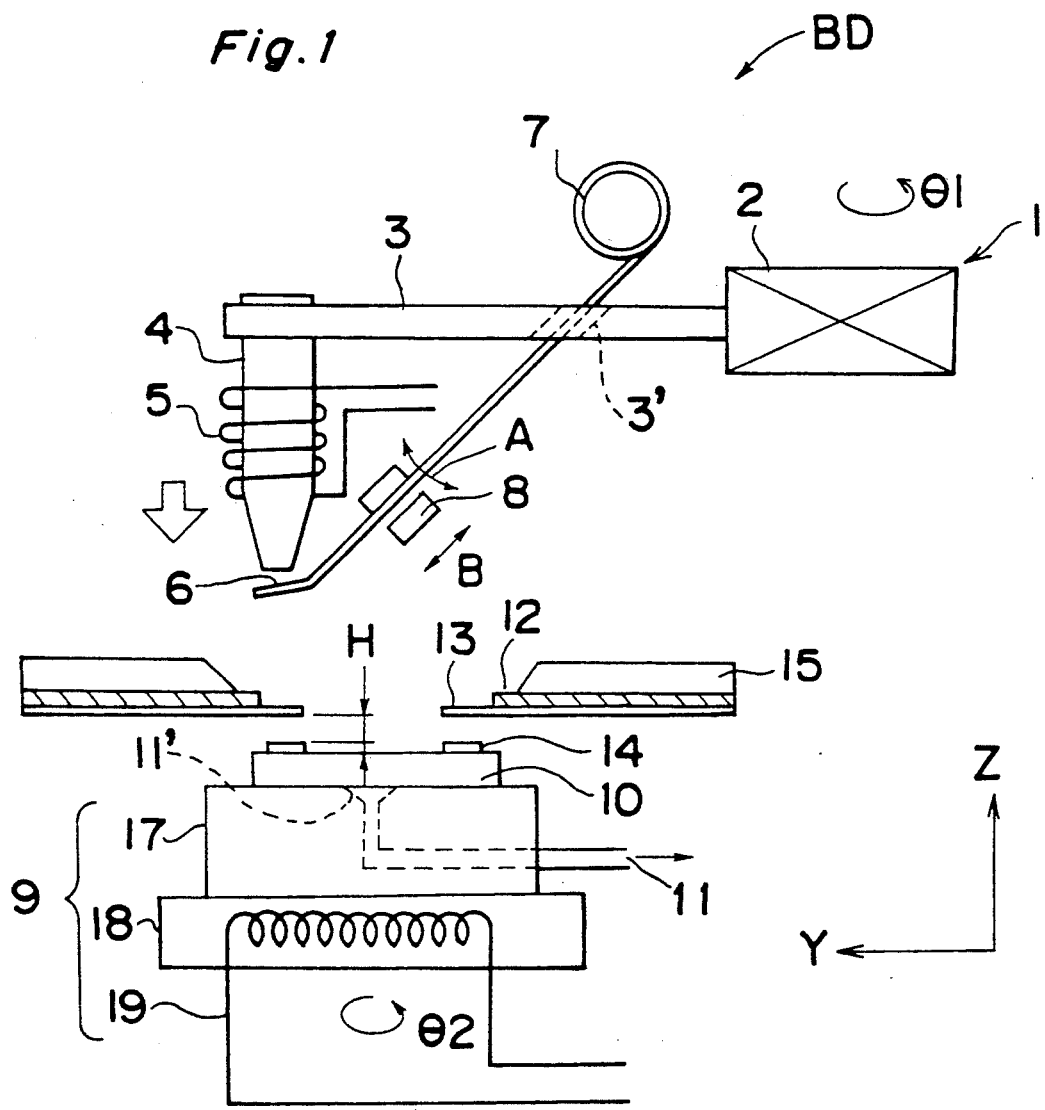
FIG. 1 is a schematic side view of a preferred embodiment of the present invention.

Referring to FIG. 1, a preferred embodiment of a bonding device according to the present invention is shown.

The bonding device BD has a first bonding head 1 and a heating stage 9 for supporting a semiconductor chip 10 placed thereon. The semiconductor chip 10 is provided with a plurality of electrode elements 14 thereon. The heating stage 9 has a base plate 18, a heater coil 19 incorporated in the base plate 18 for heating the semiconductor chip 10, and a heat absorption plate 17 mounted on the base plate 18. The heat absorption plate 17 is made by a quartz plate and formed with a suction hole 11' opened in the upper surface of the heat absorption plate 17. The suction hole 11' extends inside the heat absorption plate 17 and connects with a suction unit 11 for sucking the air through the suction hole 11' such that the semiconductor chip 10 placed on the heat absorption plate 17 is held thereat.

The first bonding head 1 has an ultrasonic generator 2, an ultrasonic horn 3 connected to and extending horizontally from the ultrasonic generator 2, and a bonding tool 4 attached to the free end of the ultrasonic horn 3 and extending downwardly. The ultrasonic generator 2 can generate ultrasonics having frequencies of 60 to 120 KHz. The ultrasonic horn 3 can transmit the ultrasonics generated by the ultrasonic generator 2 to the bonding tool 4. The first bonding head 1 is further provided with a pounding unit (not shown) for reciprocating the bonding tool 4 in vertical direction to make a pounding motion.

A through hole 3' is formed in the ultrasonic horn 3, opening at upper and lower surfaces of the horn 3 and slantwise extending in the arrow direction B toward the bottom end portion of the bonding tool 4. The bonding tool 4 is provided with a heater coil 5 wound therearound. A reel 7 and a clamp unit 8 are provided above and below the ultrasonic horn 3, respectively, almost on a line passing through the through hole 3' and the bottom end portion of the bonding tool 4. The clamp unit 8 can move in two arrow directions A and B, independently. The direction A is for clamping a bonding wire 6. The direction B is for pulling to feed the bonding wire 6 to the bonding area and for pulling back the fed bonding wire 6. When in use, the bonding wire 6 is wound around the reel 7 and led therefrom to the position under bonding tool as guided within the through hole 3' and clamp unit 8, as shown in FIG. 1.

The bonding device BD further has a film carrier support 15 for holding a film carrier 12 having a plurality of leads 13 horizontally. The film carrier 12 is supported by the film carrier support 15 such that leads 13 are located above the corresponding electrode elements 14 by a predetermined height H, i.e., 50 to 100 μm, measured from the electrode element 14, as shown in FIG. 1. The film carrier support 15 has a vertical positioning unit (not shown) for moving thereof in the direction Z, enabling the film carrier support 15 to be positioned at the predetermined height H.

Figure 2:
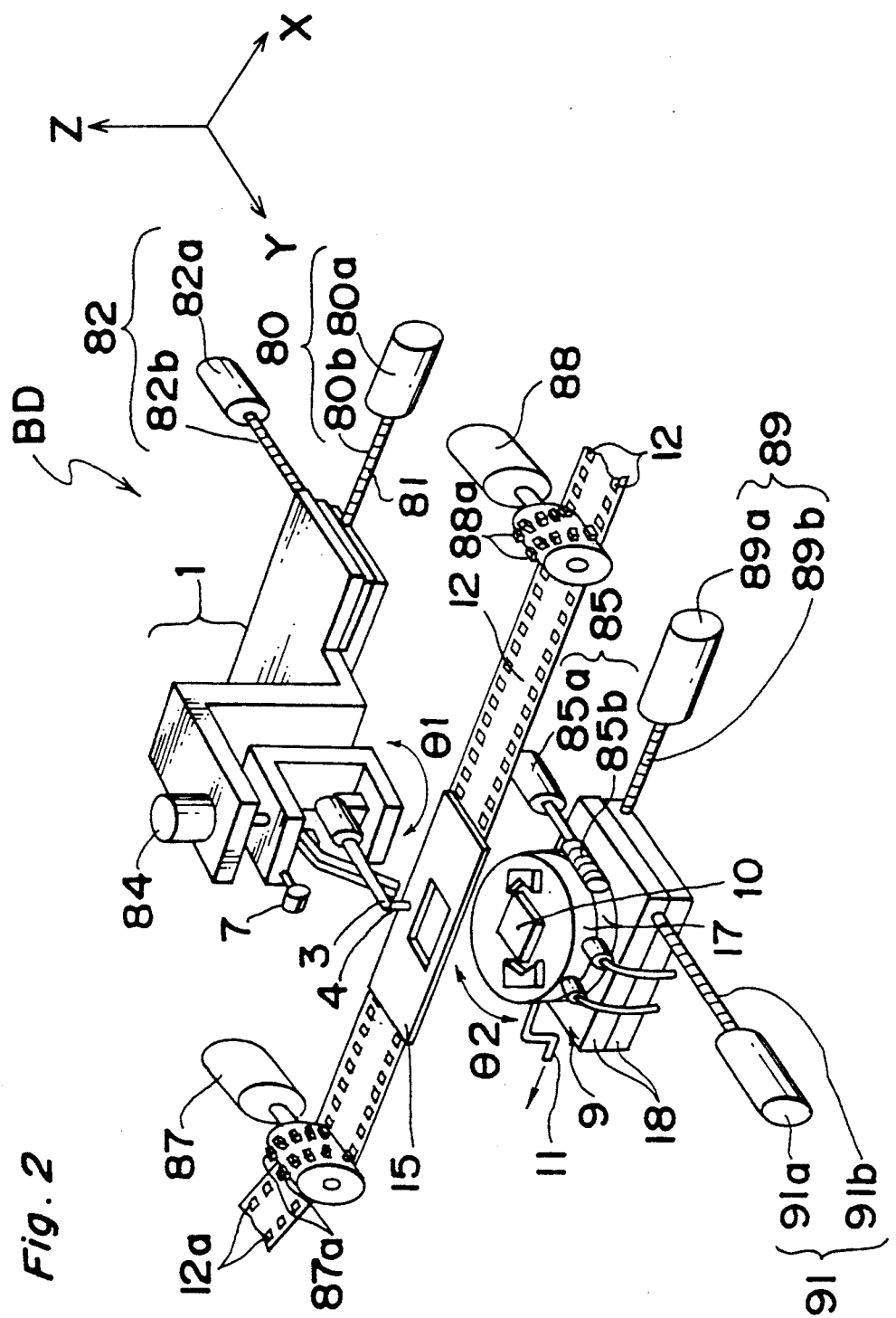
FIG. 2 is a schematic perspective view of a lead bonding device equipped with a film carrier feeding unit according to the present invention.

As best shown in FIG. 2, the film carrier 12 is made of a long sheet material and both ends thereof are wounded by reels (not shown). The film carrier 12 is formed with perforations 12a at a given pitch along opposite sides. The perforations 12a are utilized for the continuous conveyance of the film carrier 12 when the film carrier 12 is fed for bonding operation.

Referring to FIG. 2, the details of the bonding device BD shown in FIG. 1 are shown.

The first bonding head 1 is provided with a first X-axis positioning unit 80 including a first X-axis pulse motor 80a and a first X-axis ball screw 80b for moving the first bonding head 1 to a desirable position with respect to the direction X. The first bonding head 1 is further provided with a first Y-axis positioning unit 82 including a first Y-axis pulse motor 82a and a first Y-axis ball screw 82b for moving the first bonding head 1 to a desirable position with respect to the direction Y. The first bonding head 1 has a first angularly positioning unit 84 including a first pulse motor for rotating and positioning the ultrasonic horn 3 by a desirable angle $\theta 1$ with respect to a vertical axis in alignment with the direction Z. Thus, the bonding tool 4 of the first bonding head 1 can be positioned at desirable positions above any of leads 13 of the film carrier 12 by the use of those positioning units 80, 82, and 84 with higher precision. In other words, it is not necessary to move or rotate the film carrier 12, of a long sheet whose ends are wounded by reels, to let the first bonding tool 4 to pound any of the leads 13 sequentially.

The heating stage 9 is provided with a second X-axis positioning unit 89 including a second X-axis pulse motor 89a and a second X-axis ball screw 89b for moving the heating stage 9 to a desirable position with respect to the direction X. The heating stage 1 is also provided with a second Y-axis positioning unit 91 including a second Y-axis pulse motor 91a and a second Y-axis ball screw 91b for moving the heating stage 9 to a desirable position with respect to the direction Y. The heating stage 9 is further provided with a second rotating unit 85 which on the side surface of heat absorption plate 17. The second rotating unit 85 includes a second pulse motor 85a and a screw rod 85b for rotating the heat absorption plate 17 by a desirable angle θ2 with respect to the vertical axis in alignment with the direction Z. Thus, the semiconductor chip 10 held on the heat absorption plate 17 can be positioned at desirable positions under any of corresponding leads 13 of the film carrier 12 by the use of those positioning units 85, 89, and 91 with higher precision. In other words, it is not necessary to move or rotate the film carrier 12 to position the electrode elements 14 under the corresponding leads 13.

Figure 3:
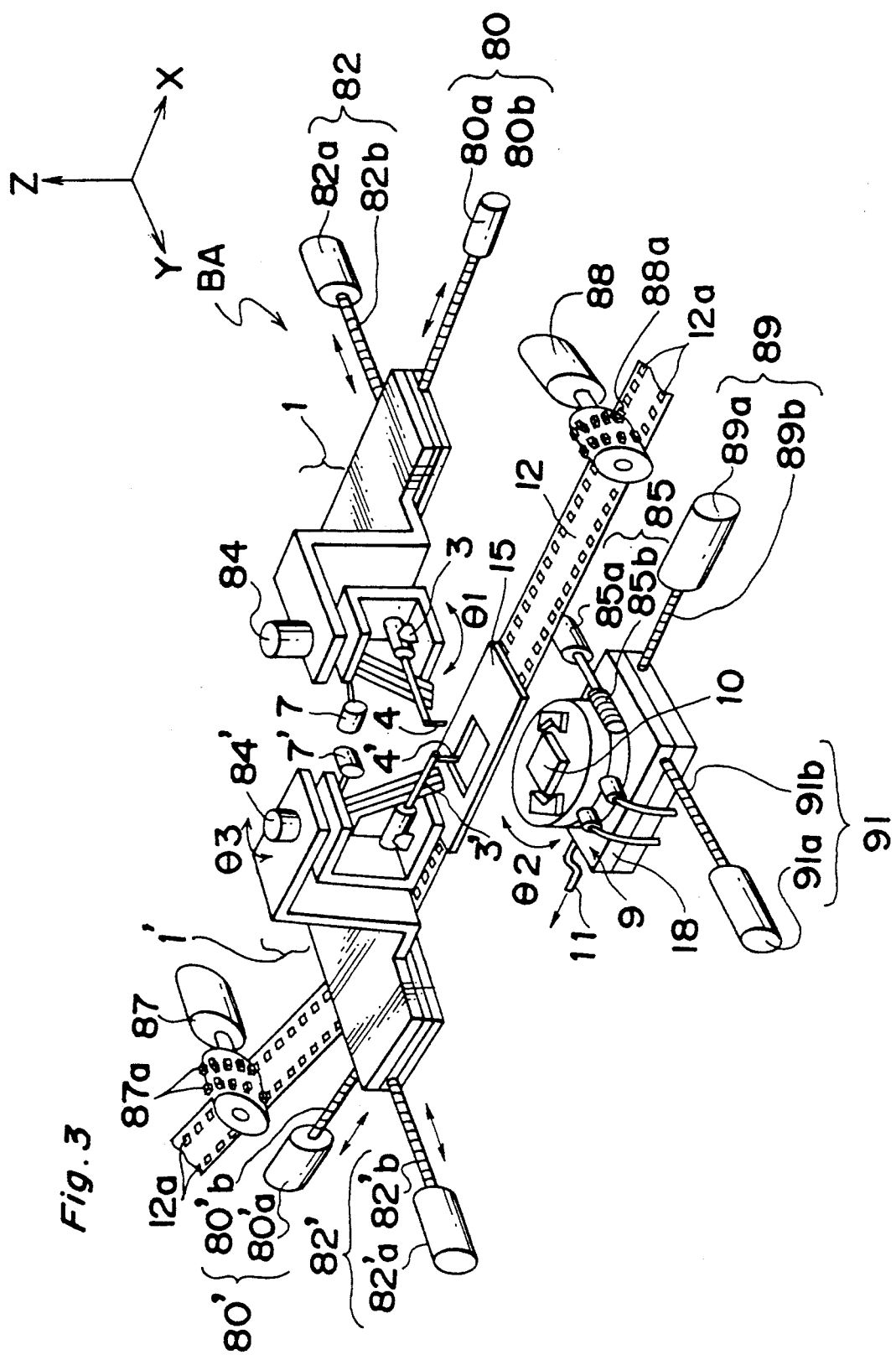
FIG. 3 is a schematic perspective view of a bonding device according to an alternative embodiment of the present invention.

Referring to FIG. 3, an alternative embodiment of the present invention is described. This alternative bonding device BA is additionally provided with a second bonding head 1' when compared with the bonding device BD shown in FIG. 2. The second bonding head 1' has a construction similar to the first bonding head 1. The second bonding head 1' is located in a position near and perpendicular to the first bonding head 1 such that the first and second ultrasonic horns 3 and 3' meet at right angles by the free end portions thereof, as shown in FIG. 3. Thus, the second bonding head 1' is located above the film carrier 12 and the bonding tool 4' can move within the bonding area of the film carrier support 15.

Since the bonding head 1' is provided with a third X-axis positioning unit 80', a third Y-axis positioning unit 82', and a second angularly positioning unit 84' for rotating the second ultrasonic horn 3' by a desirable angle θ3, the second bonding head 1' can pound on any of corresponding leads 13 of the film carrier 12 without moving or rotating the film carrier 12 in a manner similar to the first bonding head 1.

However, it is also possible to use first and second bonding heads 1 and 1' each for pounding the leads 13 each aligned in two different directions, X direction and Y direction, respectively. In this case, since the bonding heads 1 and 1' each slides only in one direction for pounding the leads 13, the movement of heads 1 and 1' for positioning can be simplified. In such a case, the angularly positioning units 84 and 84' are not required to serve so much. Thus, when two bonding heads 1 and 1' are used only for pounding in one direction each, the pounding speed can be increased. Furthermore, either one of X and Y positioning units can be removed from each of bonding heads 1 and 1', resulting in further reduction of the cost.

Figure 4:
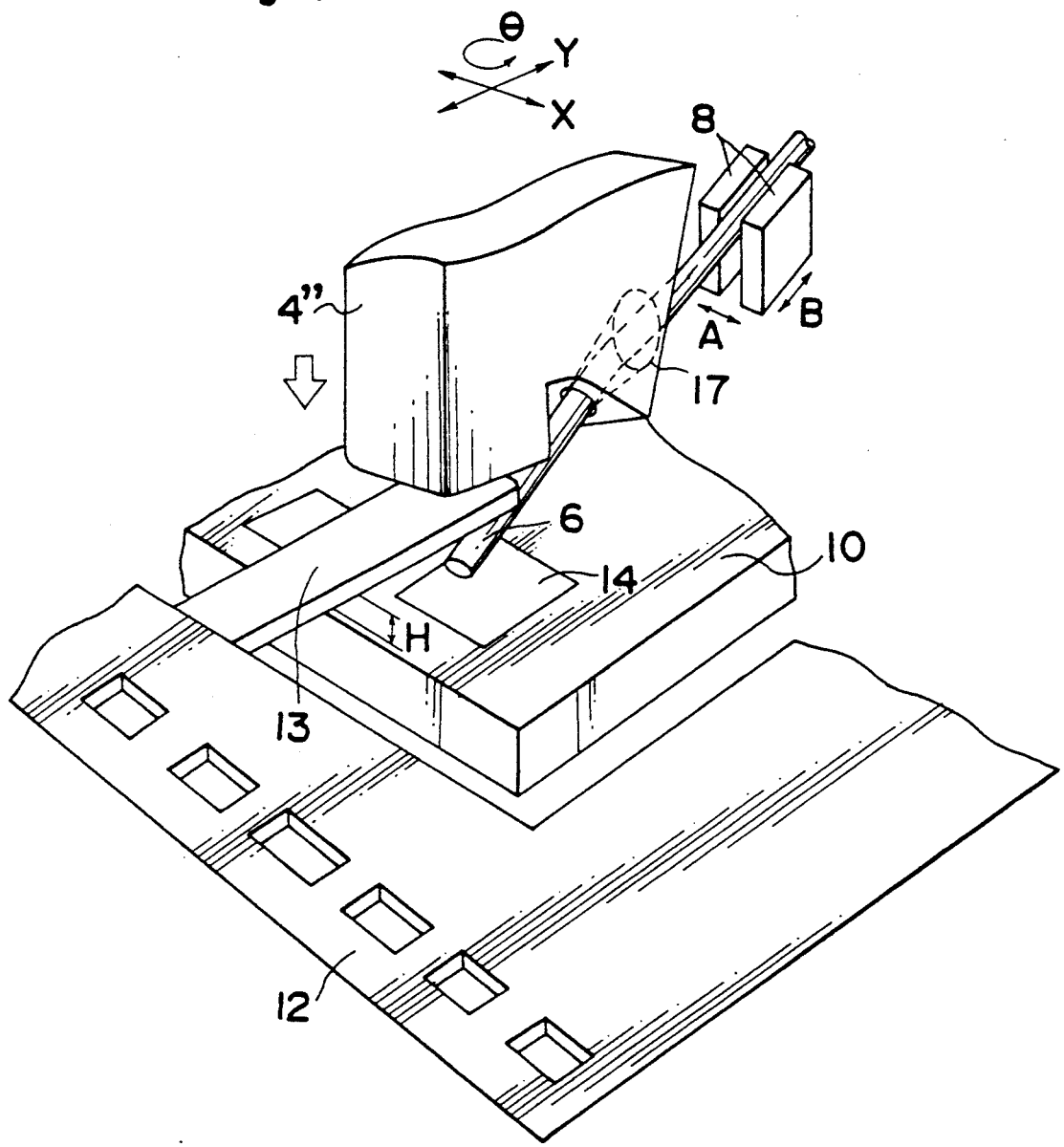
FIG. 4 is a schematic perspective view of a bonding tool according to an other alternative embodiment of the present invention.

Referring to FIG. 4, an alternative bonding tool 4" of the bonding head 1 shown in FIGS. 1 and 2 is shown. The bonding tool 4" is formed with a guide hole 17 in the back side portion thereof, opening at the bottom and back side surfaces and slantwise extending in the arrow direction B toward the through hole 3' of the ultrasonic horn 3. The bonding wire 6 is led from reel 7 passing through the hole 3' and is guided by the guide hole 17. Therefore, the end potion of the bonding wire 6 can be precisely located under the pounding area of the bonding tool 4" even when the bonding head 1 is moved by the positioning units 80, 82, and 84. Thus, the bonding tool 4" can be located above the corresponding electrode element 14 such that the lead 13 is inserted in the space between the bonding area of the bonding tool 4" and the bonding wire 6, as shown in FIG. 4. The guide hole 17 can be abolished with any other suitable mechanism which can feed and cut the bonding wire 6 at the pounding area is provided.

Referring to FIGS. 5A to 5F, the steps in which the lead 13 is bonded to the electrode element 14 by the bonding device BD according to the present invention are shown.

Figure 5A:
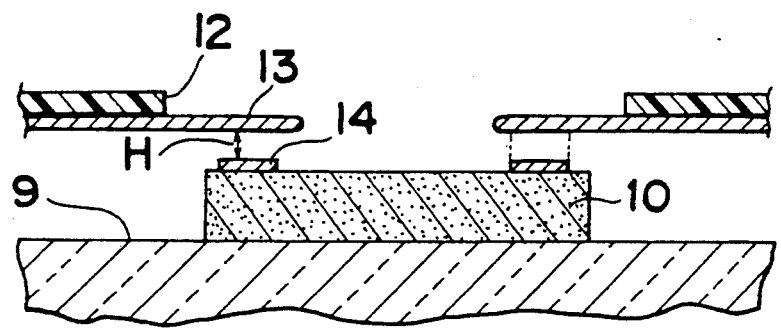
FIGS. 5A to 5F are cross-sectional views of assistance in explaining the bonding operation by the bonding device shown in FIG. 1.

As shown in FIG. 5A, at the first step, while the semiconductor chip 10 is secured on the heating stage 9, the film carrier 12 and the semiconductor chip 10 are positioned such that the lead wires 13 are located above the corresponding electrode elements 14 and at the predetermined height H. As previously described, the predetermined height H is preferably 50 to 100 μm for the precise bonding. But the predetermined height H can be determined according to the actual shapes and dimensions of the bonding material 6.

Figure 5B:
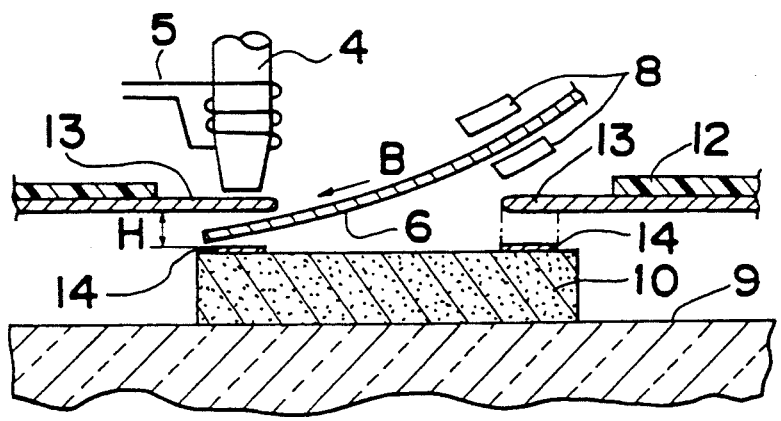

As shown in FIG. 5B, at the second step, the bonding head 1 is positioned in the bonding area such that the bonding tool 4 is located above a pair of corresponding lead 13 and electrode element 14. Then, the clamp unit 8 clamps and pulls down the bonding wire 6 in the direction B to feed the free end portion of bonding wire 6 into the space between the corresponding lead 13 and electrode element 14. Thus, the bonding wire 6 is located under the lead 13 extending in a direction aligned with the longitudinal direction of the lead 13. Then, the clamp unit 8 releases the bonding wire 6 thereat. It is possible that the bonding wire 6 is fed under the bonding tool 4 before the bonding tool is positioned above the corresponding lead 13 and electrode element 14.

It is to be noted that the leads 13 can be positioned with respect to the corresponding electrodes 14 after the bonding wire 6 is fed above the electrode 14, instead of at the first step.

Figure 5C:
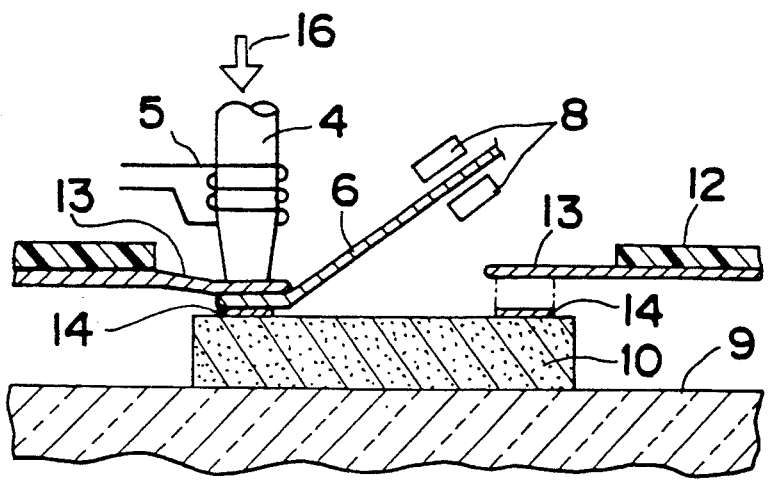

As shown in FIG. 5C, at the third step, the bonding tool 4 pounds to press a corresponding pair of leads 13 and bonding wire 6 against the electrode element 14 with a predetermined pressure L. The bonding tool 4 is applied with heat by the heater coil 5 and the ultrasonics generated by the ultrasonics generator 2.

Figure 5D:
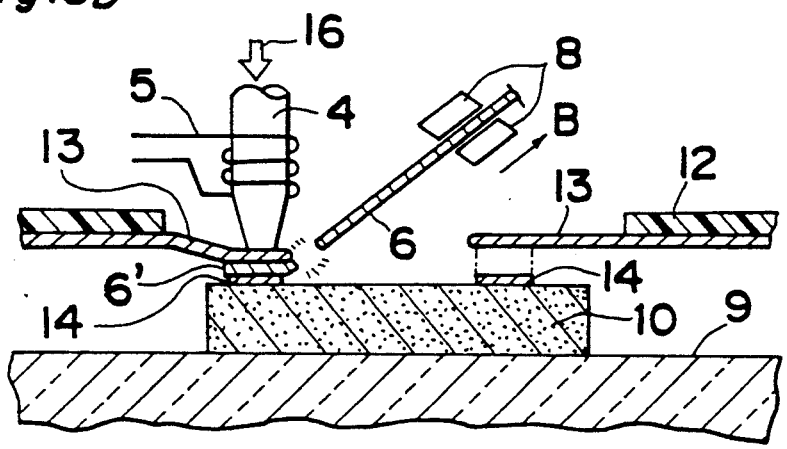

As shown in FIG. 5D, at the fourth step, while the bonding members 13 and 6 are against the electrode element 14, the clamp unit 8 clamps and pulls up the bonding wire 6 in the direction B. The bonding wire 6 will be broken at the bonding area with the bonding wire end 6' left thereon, as shown in FIG. 5D.

Figure 5E:
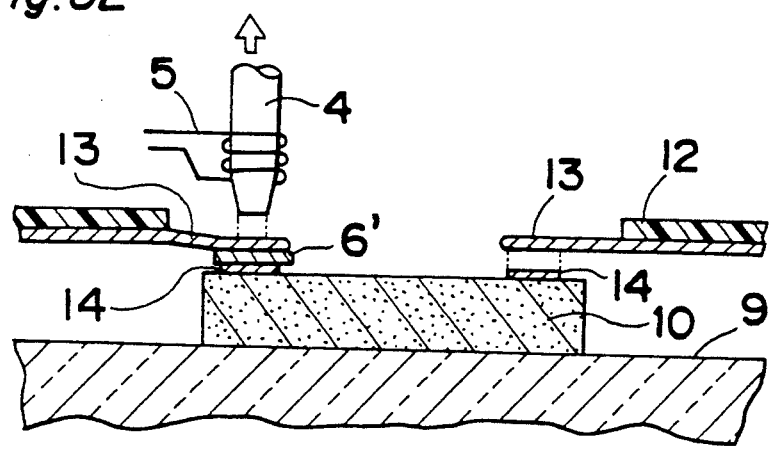

As shown in FIG. 5E, at the fifth step, the bonding tool 4 is lifted up from the bonding members 13, 6', and 14. Then, the clamp unit 8 releases the bonding wire thereat. During the pounding operation, the heat and ultrasonics generated by the heater coil 5 and the ultrasonics generator 2, respectively, are applied to the bonding members 13, 6, and 14 through the bonding tool 4. In addition to this, since the heating stage 9 heats the semiconductor chip 10, the bonding members 13, 6, and 14 can be firmly bonded each other, as shown in FIG. 5E. Thus, the lead 13 is bonded to the electrode element 14 by a single pounding stroke of the bonding tool 4.

Figure 5F:
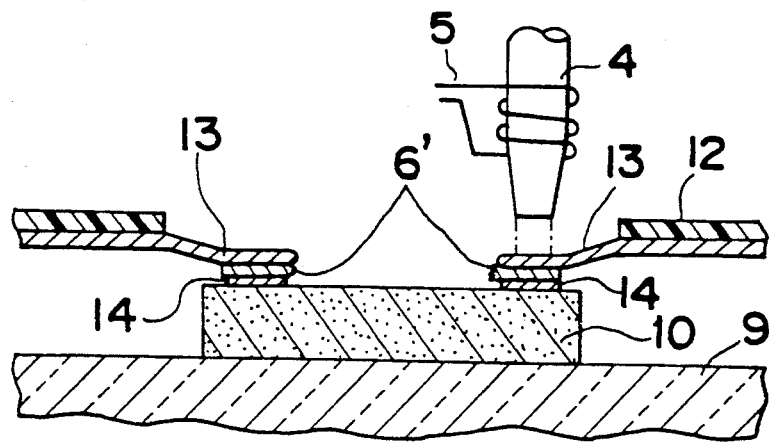

As shown in FIG. 5F, at the sixth step, the bonding head 1 is moved to the next bonding pair of lead 13 and electrode 14. At the same time the clamp unit 8 pulls down to feed the bonding wire 6 under the pounding area of the bonding tool 4. Thenafter, the second to fifth steps described above are repeated until the last pair of leads 13 and electrode element 14 are bonded. It is to be noted that the positioning of the lead 13 and the electrode 14 can be made with the higher precision and in shorter time by incorporating the pattern recognition function therein.

It is to be noted that the bonded wire end 6' can be cut after the fifth step instead of the fourth step.

Figure 6:
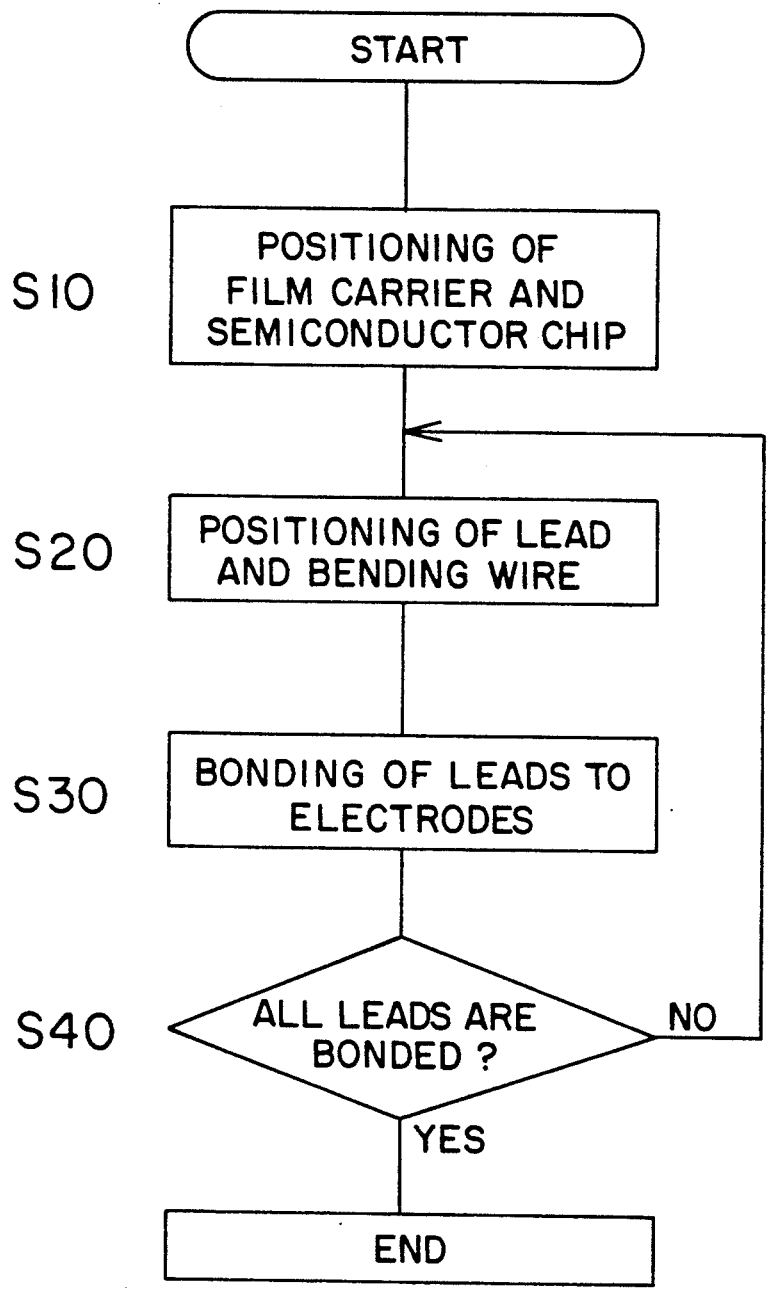
FIG. 6 is a flow chart of the operation for positioning the lead and electrode according to the bonding device of the present invention.

Referring to FIG. 6, a flow chart of the operation for positioning the lead 13 and electrode 14 is shown.

At step S10, the semiconductor chip 10 is placed on the heating stage 9 and the film carrier 12 is placed over the semiconductor chip 10 at the predetermined height H. The leads 13 are located above the corresponding electrode elements 14.

At step S20, the bonding head 1 is positioned above the corresponding lead 13. Then, the free end portion of bonding wire 6 is fed into the space between the corresponding lead 13 and electrode element 14 such that the bonding wire 6 extends aligned with the longitudinal direction of the lead 13. Then, the clamp unit 8 releases thereat. It is also possible that the bonding wire 6 is fed under the bonding tool 4 before the bonding tool is positioned above the corresponding lead 13 and electrode element 14.

At step S30, the bonding tool 4 pounds the lead 13 to press the lead 13 and the bonding wire 6 against the electrode element 14 for bonding thereof. Then the bonding wire 6 is pulled up to break thereat while the lead 13 and the bonding wire 6 are pressed against the electrode element 14.

At step S40, until the last pair of lead 13 and electrode 14 are bonded, the control returns to step S20.

Figure 7A:
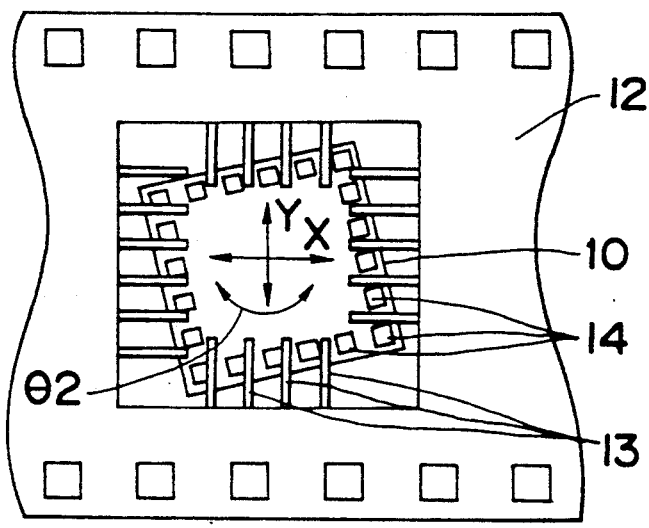
FIGS. 7A and 7B are plan views of assistance in explaining the operation of positioning the leads above the corresponding electrode elements according to the bonding devices shown in FIGS. 2 and 3.
Figure 7B:
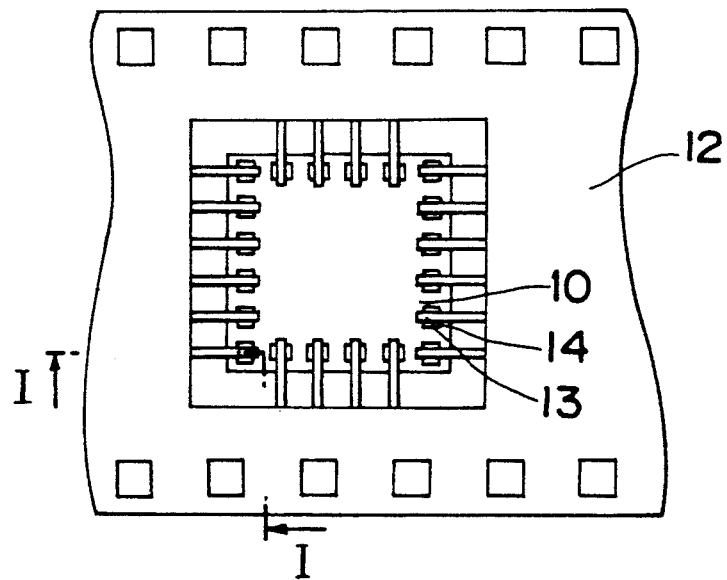
Figure 7C:
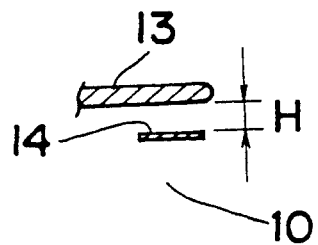
FIG. 7C is a schematic plan view showing the lead positioned over the corresponding electrode element at a predetermined height.

Referring to FIGS. 7A to 7C, the steps of positioning the leads 13 and the electrode elements 14 are shown.

As shown in FIG. 7A, at the first step, the semiconductor chip 10 is placed on and secured to the heating stage 9. However, since the leads 13 are not properly located above the corresponding electrode elements 14, it is necessary to move the semiconductor chip 10 by some lengths with respect to the X and Y directions and rotate by some degree θ2 for proper bonding.

As shown in FIG. 7B, at the second step, the semiconductor chip 10 is moved by the positioning units 85, 89, and 91 so that the leads 13 each is located above each of corresponding electrodes 14. It is to be noted that the positioning of the higher level can be made with the higher precision by using the pattern recognition system composed of optical devices such as cameras. The leads 13 can be positioned at the predetermined height H, as shown in FIG. 7C, together with those described positioning.

Figure 8A:
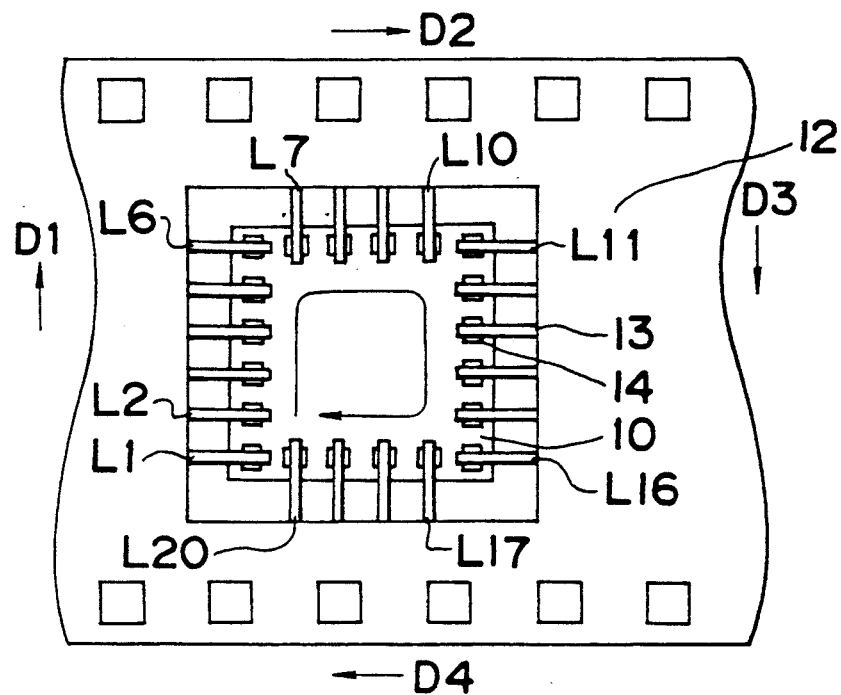
FIGS. 8A and 8b are plan views of assistance in explaining the sequential order of bonding the leads according to the bonding device shown in FIGS. 2 and 3.
Figure 8B:
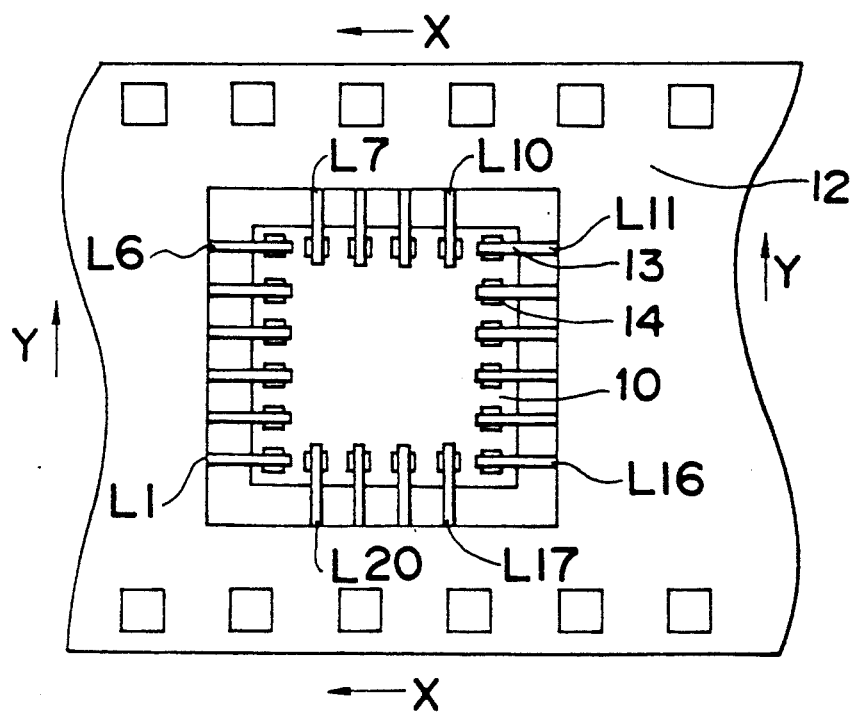

Referring to FIGS. 8A and 8B, the sequential order of bonding the leads 13 and the electrode elements 14 are shown.

As shown in FIG. 8A, the sequential order of bonding the lead 13 to the electrodes 14 by the bonding device BD shown in FIG. 2 is shown. Among the corresponding pairs of corresponding leads 13 and electrode 14, any one corresponding pair is bonded first. Since the bonding device BD has the first bonding head 1 only, only one pair of lead 13 and electrode 14 can be bonded by pounding stroke of the bonding tool 4. Then, the next pair neighboring to the previously bonded pair is bonded subsequently. For example, shown in FIG. 8A, the lead 13 at the position L1 is bonded first. Then, the bonding head 1 moves in the arrow direction D1 and bonds the leads 13 on positions L2 to L6 (aligned in X direction) subsequently. After bonding the leads on position L6, the bonding head 1 moves in the arrow direction D2 ) perpendicular to the direction D1 and bonds the leads 13 on positions L7 to L10 (aligned in Y direction) subsequently. After bonding the leads on position L10, the bonding head 1 moves back in the arrow direction D3 parallel to the direction D1 and bonds the leads 13 on positions L11 to L16 (aligned in X direction). After bonding the lead 13 on position L16, the bonding head 1 moves back in the arrow direction D4 parallel to the direction D2 and bonds the leads 13 on positions L17 to L20 (aligned in Y direction). Thus, all the leads 13 (L1 to L20) are subsequently bonded by 20 strokes of the bonding head 1.

As shown in FIG. 8B, the sequential orders of bonding by the alternative bonding device BA shown in FIG. 3 are shown. The bonding device BA has the first and second bonding heads 1 and 1' each of which is used for bonding the leads 13 aligned in each single direction. For example, the first and second bonding head 1 and 1' are used for leads 13 aligned in the Y direction and the X direction, respectively.

In this case, the first bonding head 1 starts bonding the leads 13 from the position L1 toward the position L6 subsequently. After bonding the leads 13 on the position L6, the first bonding head 1 moves to the position L16, and bonds the leads 13 on positions 16 toward position L11. Similarly, the second bonding head 1' starts bonding leads 13 from L17 toward the position L20 subsequently. After bonding the lead 13 on position L20, the second bonding head 1' moves to the position L11, and bonds the leads 13 on position L10 toward position L7. Since the bonding wire 6 is properly located under and in alignment with the lead 13 by the use of pattern recognition system, the bonding device BA can bond the two pairs of leads 13 and electrodes 14 by one pounding time with the extremely higher precision highly efficiently.

As the bonding wire 6, the usual bonding wires made of metallic material such as gold, aluminum, copper, and silver having a diameter of 20 to 200 $\mu$m used for the conventional wire bonding technology can be used without applying any modification or process thereto, preventing the bonding material's cost from increasing. The bonding wire 6 preferably has the diameter equal to or greater than the width of lead 13 by 10 to 20%, enabling the pitch at the leads 13 to be less than 50 $\mu$m. Thus, the present invention can be applied to the TAB packaging of the semiconductor chip having a large area and a plurality of terminals.

Figure 9A:
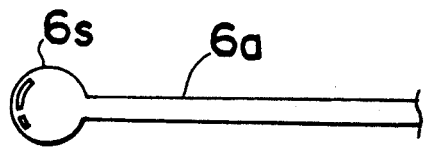
FIGS. 9A and 9B are schematic views of the bonding wire according to an other alternative embodiment of the present invention.
Figure 9B:
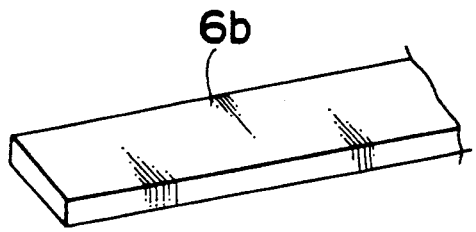

Referring to FIGS. 9A and 9B, an alternative embodiment of the bonding wire 6 is shown. The bonding wire 6 can be formed in any other form than the usual bonding wire shape.

As shown in FIG. 9A, the bonding wire 6a having a spherical portion 6s at the free end thereof can be used. Since the spherical portion 6s can be stably bonded to the lead 13 even if the bonding wirer 6a is inclined with respect to the lead 13, it is not necessary to insert the bonding wire 6a the space under the lead 13 such that the boding wire 6a is in alignment with the lead 13.

As shown in FIG. 9b, the bonding plate 6b formed in a flat plate-like configuration, made of gold, copper, and silver, can be used.

Furthermore, the bonding material made of low melting metals such as solders can be used in combination with the leads plated with gold, zinc, and nickel. In this combination, the bonding tool 4 heated by the heater coil 5 is pressed against the leads for a predetermined period so that the low melting metal melts, causing the leads to bond to the electrodes 14.

An organic bonding material including the conductive materials, for example, such as the conductive adhesion agent formed in a stick like shape (not shown) or a bar-like shape (not shown) can be used. This organic bonding material is pressed between the lead 13 and electrode 14 by the heated bonding tool 4 so the organic bonding material becomes hardened and bonds therebetween.

Figure 10:
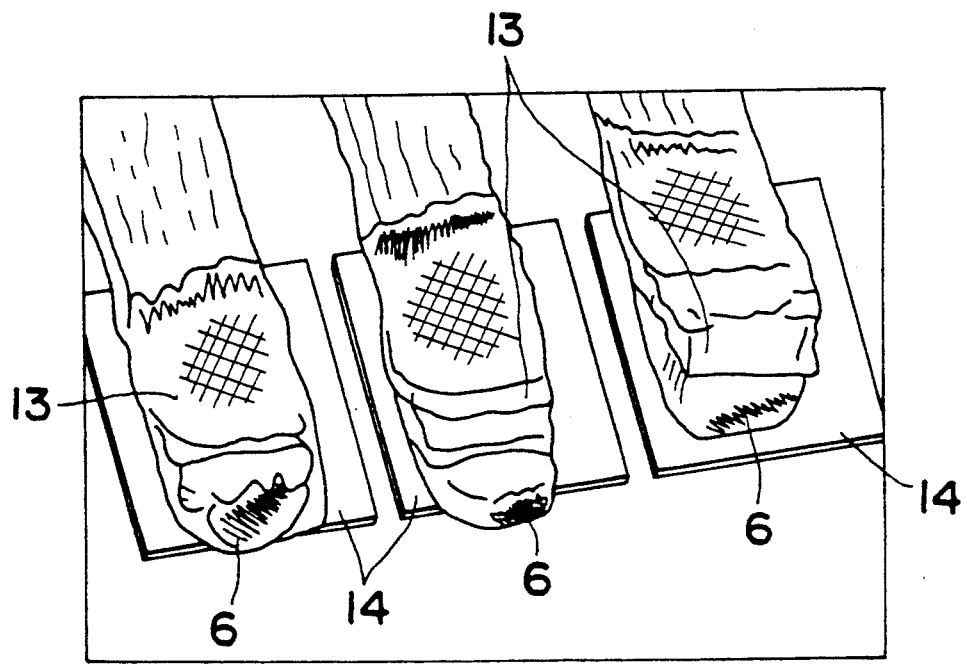
FIG. 10 is a photograph picture of the portion in which the leads and electrodes are bonded together by the bonding material according to the present invention in a large scale.
Figure 11A:
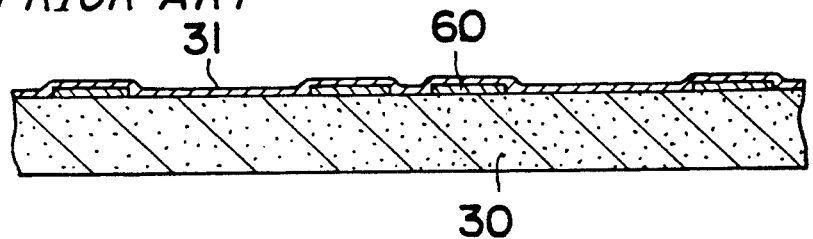
FIGS. 11A to 11E are cross-sectional views of assistance in explaining the operation of forming bumps on the semiconductor wafer according to the conventional bump-on-wafer technology.
Figure 11B:
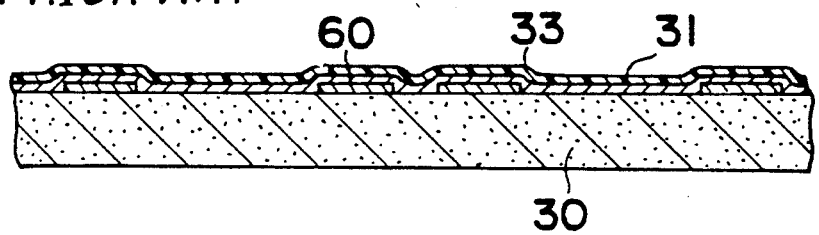
Figure 11C:
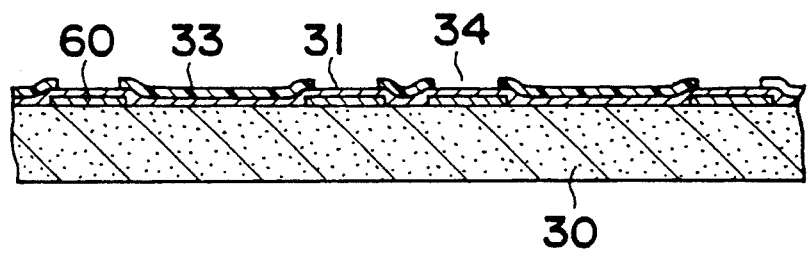
Figure 11D:
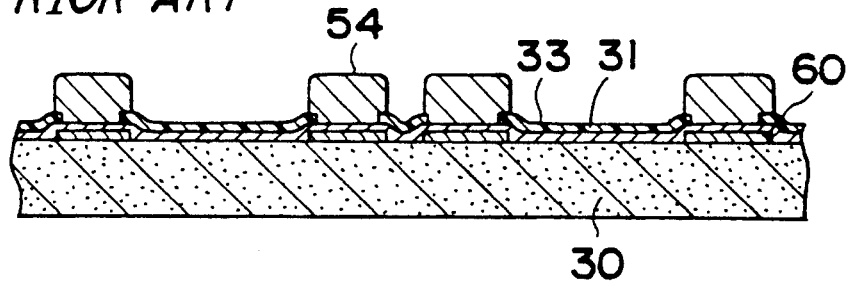
Figure 11E:
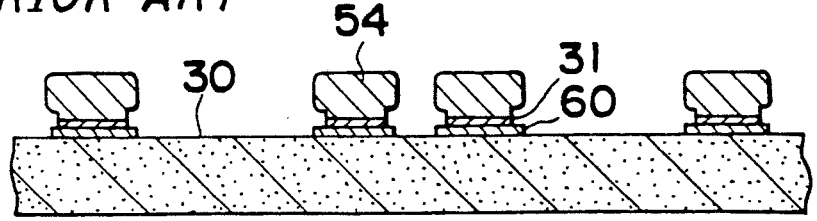
Figure 12A:
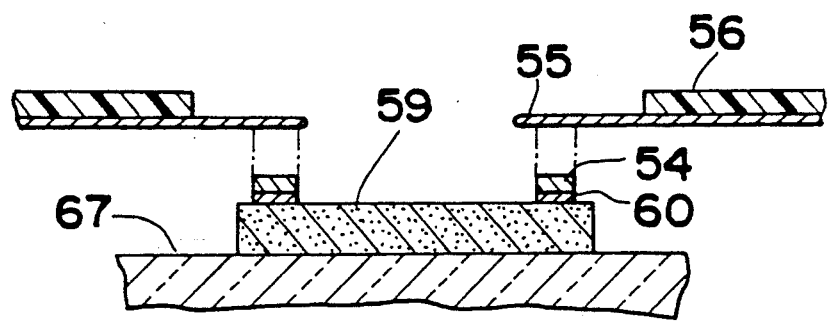
FIGS. 12A to 12C are cross-sectional views of assistance in explaining the operation of bonding leads with bumps according to the conventional bonding method.
Figure 12B:
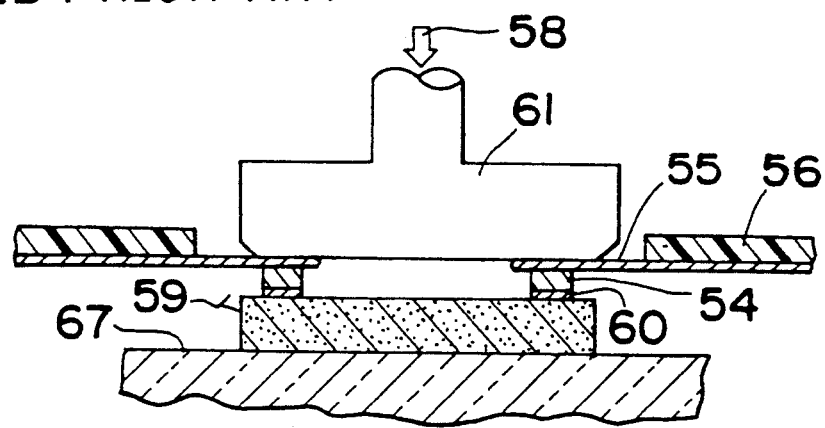
Figure 12C:
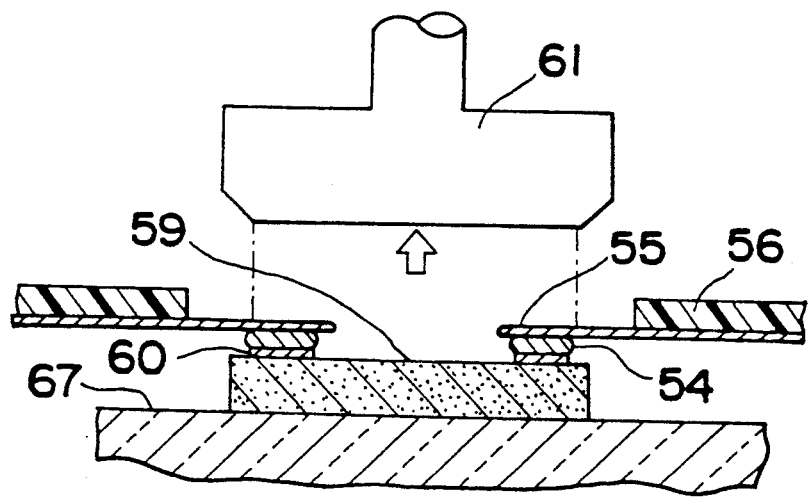
Figure 13A:
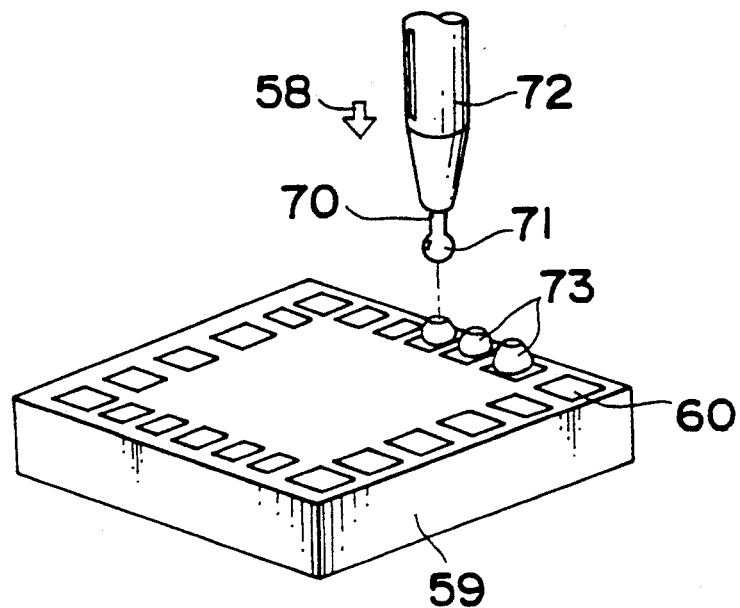
FIGS. 13A and 13B are schematic perspective views showing the operation of forming bumps on the electrodes according to another conventional bonding method.
Figure 13B:
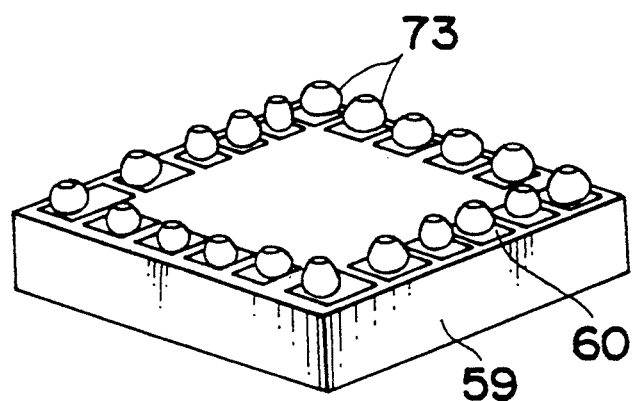
Figure 14A:
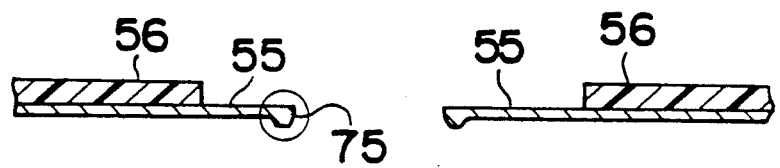
FIGS. 14A and 14B are schematic views showing the bumps formed on the lead according to an other conventional bonding method.
Figure 14B:
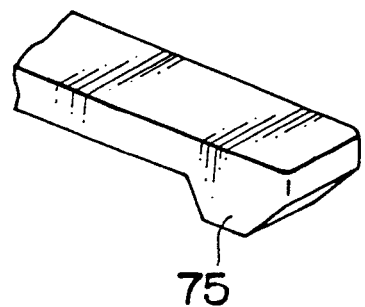
Figure 15:
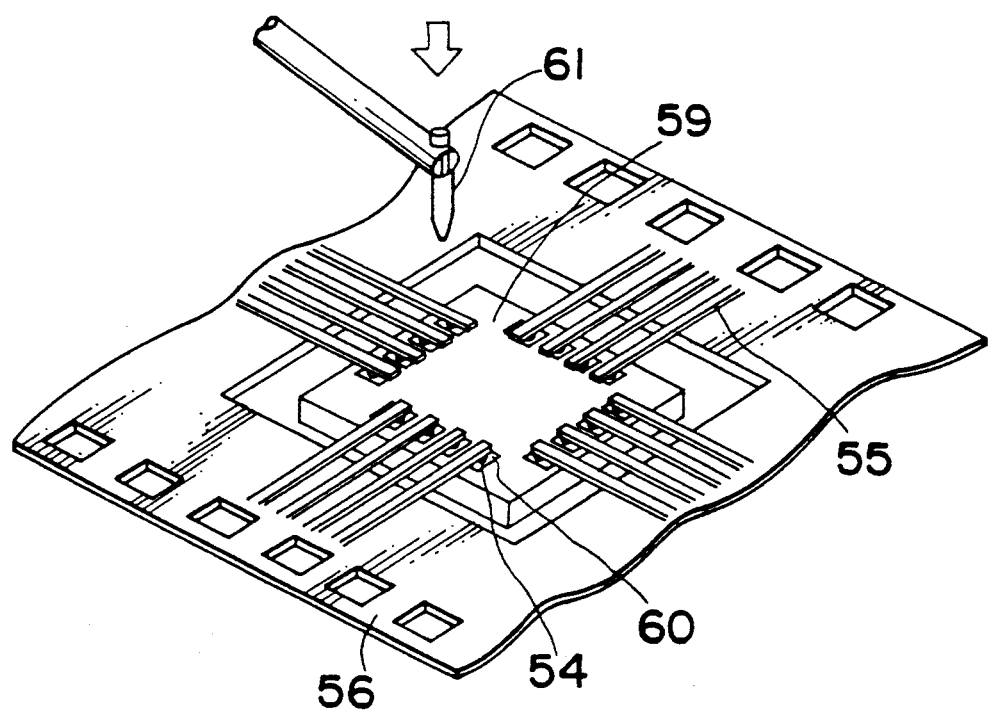
FIG. 15 is a schematic perspective view showing the bonding operation according to a conventional single-point bonding method.
Figure 16A:
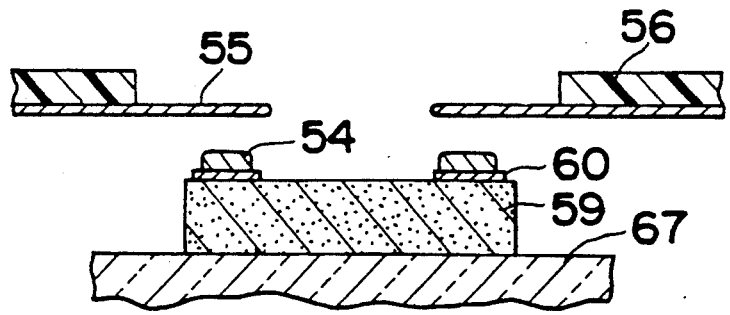
FIGS. 16A to 16C are cross-sectional views of assistance in explaining the bonding operation according to the conventional single-point bonding method shown in FIG. 15.
Figure 16B:
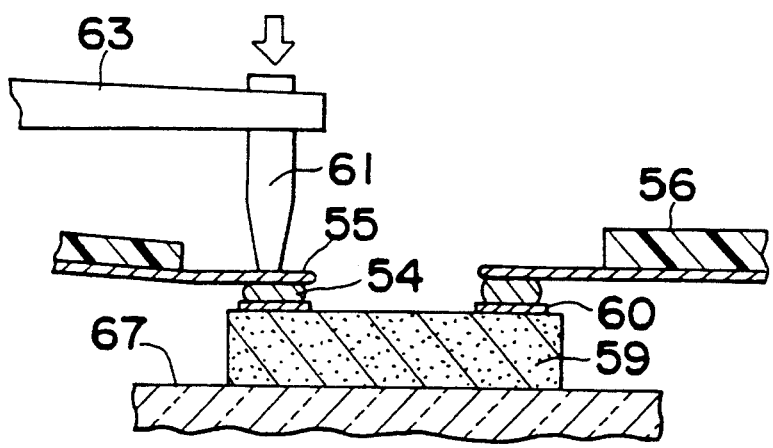
Figure 16C:
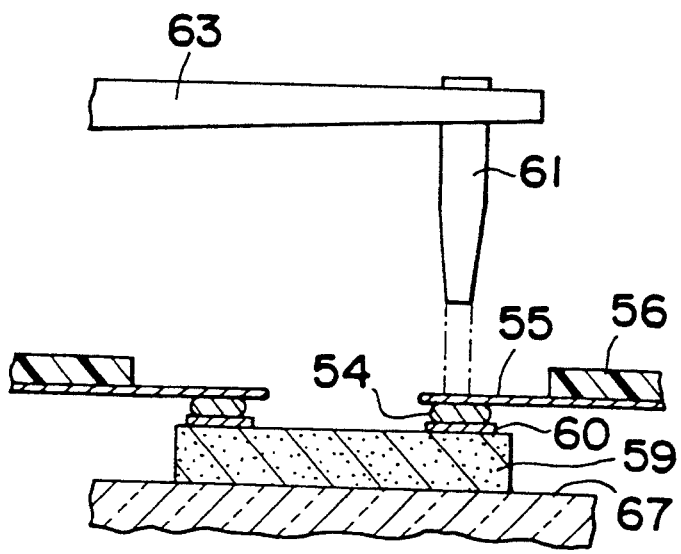

Referring to FIG. 10, a photograph picture of the lead 13 bonded to the electrode 14 with the bonding material 6 therebetween by the bonding device according to the present invention in a large scale is shown. In this case, the lead 13 which is made by a rolled steel having a thickness of 35 $\mu$m and a width of 50 $\mu$m, and is provided with a gold plating having a thickness of 1.5 $\mu$m applied thereto is used. The bonding wire 6 which is made by a golden wire having a diameter of 50 $\mu$m and with the purity of 99.9999% and is usually sold for the wire bonding technology in the market is used. The electrode element 14 is made by an aluminum film having a thickness of 1 $\mu$m. The bonding is made by the usual wire bonding device with necessary modifications added thereto under the following conditions. bonding load is 80 gf, bonding temperature is 350° C. The power of ultrasonics generation is 0.8 W. The ultrasonic applying time is 100 ms. The obtained bonded portion provides the shearing strength of 10 to 13 Kg/mm$^2$ which is equivalent to that of conventional TAB leads made by the conventional bonding device. Additionally, the bonded condition is also good, as shown in FIG. 10. Thus, the bonding experiment according to the present invention can be applied to the bonding of the semiconductor chip for TAB packaging.

In the bonding method according to the present invention, since the process of bump forming steps independently from the pounding step is not required, all facilities and steps currently required for bump forming are not needed, enabling to prepare for TAB packaging of semiconductor chips having various kinds in a small production lot at a lower cost. Furthermore, the conventional wire bonding device can be applied to the bonding method according to only some modification added thereon, serving an advantage for realization thereof.

As is clear from the above description, the bonding method according to the present invention provides the following advantages when applied to TAB packaging of the semiconductor chip.

In the present invention, the bump forming steps which was conventionally performed before and independently from the pounding step of the bonding tool is abolished. And the bumps are made at the same time when the bonding tool pounds on the leads for bonding thereof, resulting in a decrease of the bonding cost.

Therefore, the facilities and materials conventionally required for bump forming are also abolished, resulting in decrease of the bump forming cost.

Also, since the semiconductor wafers and chips becomes free from the fault caused by the bump forming steps according to the photolithograph and etching process, the yielding rate of the product is improved.

Since the semiconductor wafers, semiconductor chips, and film carriers do not need the bump forming before the bonding steps, the semiconductor chip can be TAB packaged easily even in the distributors' or users' site. TAB packaging technology can be widely used in the sites other than semiconductor manufacturer.

Since the width of the bonded portions can be less than that of the leads, the leads can be bonded to the electrodes at the pitch less than 50 $\mu$m. Thus, the present invention can be applied to bonding a plurality of leads to high integration electrodes of the semiconductor chip and to the TAB packaging of LSI and VLSI having a large size and extremely multi terminals and the multi-chip modules.

In the present invention, since the usual bonding wires used for the conventional wire bonding technology can be used for the bonding method without applying any modification or process thereto, it is not necessary to prepare the new..material, special for the present invention, preventing an increase in the bonding material's cost. Furthermore, the bonding material made of low melting metals such as solders can be used in combination with the leads in a manner more simple than that of the conventional methods. Similarly, the organic bonding material including the conductive materials also can be used.

In the conventional ball bump technology, the electrode elements of the semiconductor chip suffers from such stresses as an impact load and two thermal stresses, when the bump is formed thereon and when the lead is bonded with the bump. Such stresses cause the oxide layer under the electrode element to crack, resulting in the decrease of yield. However, according to the present invention, since the electrode elements are pressed only once when the leads are bonded thereto, the stresses applied to the oxide layer is a half of that in conventional ball bump technology. Thus, the oxide layer under the electrodes are kept from being broken and cracked, and the semiconductor chip from the electrostatic damage, resulting in the extremely improved yield.

As described above, the bonding method according to the present invention can provide significant effects and conveniences, when applied to TAB packaging of the semiconductor chips.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for bonding leads of a film carrier to electrodes of electronic devices, said method comprising the steps of:

positioning said leads and said electrodes with a predetermined clearance therebetween such that said leads and said electrodes are aligned to define corresponding pairs of said leads each and said electrodes each;

placing a pressure means having a contact area and a conductive bonding material served under said contact area such that said conductive bonding material is located between a first of said leads and a first of said electrodes of a first of said corresponding pairs;

pressing said first lead of said first corresponding pair by said contact area of said pressure means such that said conductive bonding material is pressed between said first lead and said first electrode with a predetermined pressure for bonding said first corresponding pair;

pulling said conductive bonding material for cutting said conductive bonding material at a position near said bonded lead and electrode;

releasing said pressure means from said bonded lead and electrode; and serving said conductive bonding material under said contact area of said pressure means.

2. A method as claimed in claim 1, wherein said conductive bonding material has a spherical portion used for bonding said leads and said electrodes.

3. A method as claimed in claim 1, further comprising applying heat through said pressure means to said first lead during the step of pressing said first lead to firmly bond said first lead to said first electrode.

4. A method for bonding leads of a film carrier to electrodes of electronic devices, said method comprising the steps of:

first positioning said leads and said electrodes with a predetermined clearance therebetween;

placing a pressure means having a contact area with a conductive bonding material served under said contact area such that said conductive bonding material is located in said predetermined clearance and aligned with said electrode;

second positioning said leads aligned with said electrodes such that said leads and said electrodes are aligned to define corresponding pairs of said leads each and said electrodes each;

pressing said lead aligned with said conductive bonding material by said contact area of said pressure means such that said conductive bonding material is pressed between said lead and said electrode with a predetermined pressure for bonding therebetween;

pulling said conductive bonding material for cutting said conductive bonding material at a position near said bonded lead and electrode;

releasing said pressure means from said bonded lead and electrode; and serving said conductive bonding material under said contact area of said pressure means.

5. A method for bonding leads of a film carrier to electrodes of electronic devices, said method comprising the steps of:

positioning said leads and said electrodes with a predetermined clearance therebetween such that said leads and said electrodes are aligned to define corresponding pairs of said leads each and said electrodes each;

placing a pressure means having a contact area and a conductive bonding material served under said contact area such that said conductive bonding material is located between a first of said leads and a first of said electrodes of a first of said corresponding pairs;

pressing said first lead of said first corresponding pair by said contact area of said pressure means such that said conductive bonding material is pressed between said first lead and said first electrode with a predetermined pressure for bonding said first corresponding pair;

releasing said pressure means from said bonded lead and electrode;

serving said conductive bonding material under said contact area of said pressure means; and cutting said conductive bonding material at a position near said bonded lead and electrode.

6. A method for bonding leads of a film carrier to electrodes of electronic devices, said method comprising the steps of:

positioning said leads and said electrodes with a predetermined clearance therebetween such that said leads and said electrodes are aligned to define corresponding pairs of said leads each and said electrodes each;

placing a conductive bonding material between a first of said leads and a first of said electrodes of a first of said pairs; and applying a predetermined pressure to said first pair such that said conductive bonding material is pressed against said first lead and said first electrode for bonding said first lead and said first electrode.

7. A method as claimed in claim 6, further comprising a step of pulling said conductive bonding material for cutting said conductive bonding material at a position near said bonded lead and electrode.

8. A method as claimed in claim 7 further comprising a step of releasing said predetermined pressure from said bonded lead and electrode.

* * * * *